US010512173B1

(12) United States Patent
Hiwatashi et al.

(10) Patent No.: US 10,512,173 B1
(45) Date of Patent: Dec. 17, 2019

(54) WIRING BOARD

(71) Applicant: KYOCERA Corporation, Kyoto-shi, Kyoto (JP)

(72) Inventors: Toshihiro Hiwatashi, Satsumasendai (JP); Rintaro Kamimura, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/506,972

(22) Filed: Jul. 9, 2019

(30) Foreign Application Priority Data

Jul. 26, 2018 (JP) .................................. 2018-140374
Aug. 24, 2018 (JP) .................................. 2018-157551

(51) Int. Cl.
| H05K 3/42 | (2006.01) |
| H01L 23/12 | (2006.01) |
| H05K 1/11 | (2006.01) |
| H05K 1/18 | (2006.01) |
| H01L 23/538 | (2006.01) |
| H01L 21/48 | (2006.01) |

(52) U.S. Cl.
CPC ........... *H05K 3/42* (2013.01); *H01L 21/4846* (2013.01); *H01L 23/12* (2013.01); *H01L 23/5384* (2013.01); *H01L 23/5386* (2013.01); *H05K 1/115* (2013.01); *H05K 1/183* (2013.01); *H05K 1/186* (2013.01)

(58) Field of Classification Search
CPC .......... H05K 3/42; H05K 1/115; H05K 1/183; H05K 1/186; H01L 21/4846; H01L 23/12; H01L 23/5386; H01L 23/5384
USPC ....................................... 174/250, 260, 262
See application file for complete search history.

(56) References Cited

U.S. PATENT DOCUMENTS

| 2014/0291005 A1* | 10/2014 | Fukushima | .......... | H05K 3/4602 |
| | | | | 174/262 |
| 2015/0305155 A1* | 10/2015 | Shiroshita | ............ | H05K 1/0228 |
| | | | | 174/266 |
| 2016/0192475 A1* | 6/2016 | Nakagawa | ........... | H05K 1/0245 |
| | | | | 174/262 |

FOREIGN PATENT DOCUMENTS

JP  2003-188305 A  7/2003

\* cited by examiner

*Primary Examiner* — Sherman Ng
(74) *Attorney, Agent, or Firm* — Volpe and Koenig, P.C.

(57) ABSTRACT

A wiring board of the present disclosure includes: an insulating base having a first surface including a mounting region and a second surface connected to an external board; a power supply conductor including a first planar conductor, and first linear conductors; a grounding conductor including a second planar conductor, and second linear conductors; power supply terminals, being electrically connected to the first planar conductor; and grounding terminals being electrically connected to the second planar conductor.

5 Claims, 4 Drawing Sheets

WIRING BOARD

BACKGROUND OF THE INVENTION

1. Technical Field

The present disclosure relates to a wiring board.

2. Background

In recent years, development of highly functional electronic apparatuses for performing high-speed arithmetic processing represented by a super computer or the like has been advanced. Such an electronic apparatus includes a plurality of wiring boards on which semiconductor integrated circuit elements are mounted, as described in, for example, Japanese Patent Application Laid-open No. 2003-188305. Since a plurality of wiring boards are mounted on an electronic apparatus, the wiring boards are required to be miniaturized. Each wiring board includes an insulating base in which a plurality of insulating layers are laminated, a wiring conductor including a power supply conductor and a grounding conductor positioned on the surface of each insulating layer, a terminal for connecting a semiconductor integrated circuit element positioned on the uppermost surface of the insulating base, and a terminal for connecting an external board positioned on the lowermost surface of the insulating base.

SUMMARY

Incidentally, the above-described semiconductor integrated circuit element requires a large amount of power to perform arithmetic processing at high speed. A wiring board on which such a semiconductor integrated circuit element is mounted is required to have excellent power supply characteristics. In order to improve the power supply characteristics, for example, it is conceivable to provide many power supply conductors and grounding conductors being power supply paths in the wiring board. However, since this requires many areas for providing a power supply path, there is a possibility of making it difficult to miniaturize the wiring board.

A wiring board of the present disclosure includes: an insulating base having a first surface including a mounting region for mounting a semiconductor integrated circuit element and a second surface connected to an external board, the insulating base in which a plurality of insulating layers are laminated; a power supply conductor including on the first surface: a first planar conductor positioned in one side region around the mounting region, and a plurality of first linear conductors protruding from the first planar conductor into the mounting region in a comb-shaped state, the plurality of first linear conductors to which a plurality of respective power supply electrodes of the semiconductor integrated circuit element are connected; a grounding conductor including on the first surface: a second planar conductor positioned in a region opposite to the one side region around the mounting region, and a plurality of second linear conductors protruding from the second planar conductor into the mounting region in a comb-shaped state to be alternately adjacent to the first linear conductors, the plurality of second linear conductors to which a plurality of respective grounding electrodes of the semiconductor integrated circuit element are connected; a plurality of power supply terminals, on the second surface, positioned in a first region overlapping with the first planar conductor in a plan perspective view, the plurality of power supply terminals being electrically connected to the first planar conductor through a first through conductor penetrating each of the plurality of insulating layers between the first planar conductor and the first region; and a plurality of grounding terminals, on the second surface, positioned in a second region overlapping with the second planar conductor in a plan perspective view, the plurality of grounding terminals being electrically connected to the second planar conductor through a second through conductor penetrating each of the plurality of insulating layers between the second planar conductor and the second region.

The wiring board of the present disclosure can be miniaturized and can have excellent power supply characteristics.

DETAILED DESCRIPTION

Figure 1:
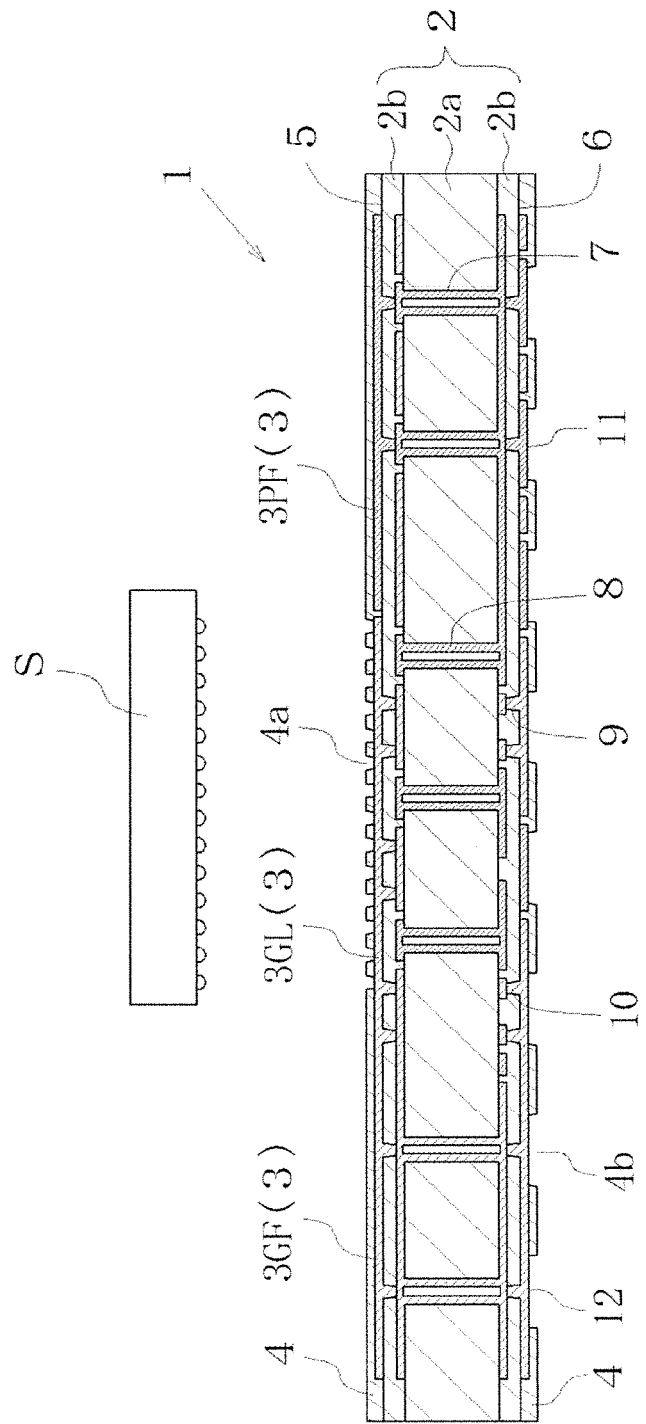
FIG. 1 is a schematic cross-sectional view for illustrating a wiring board according to the present disclosure.
Figure 2:
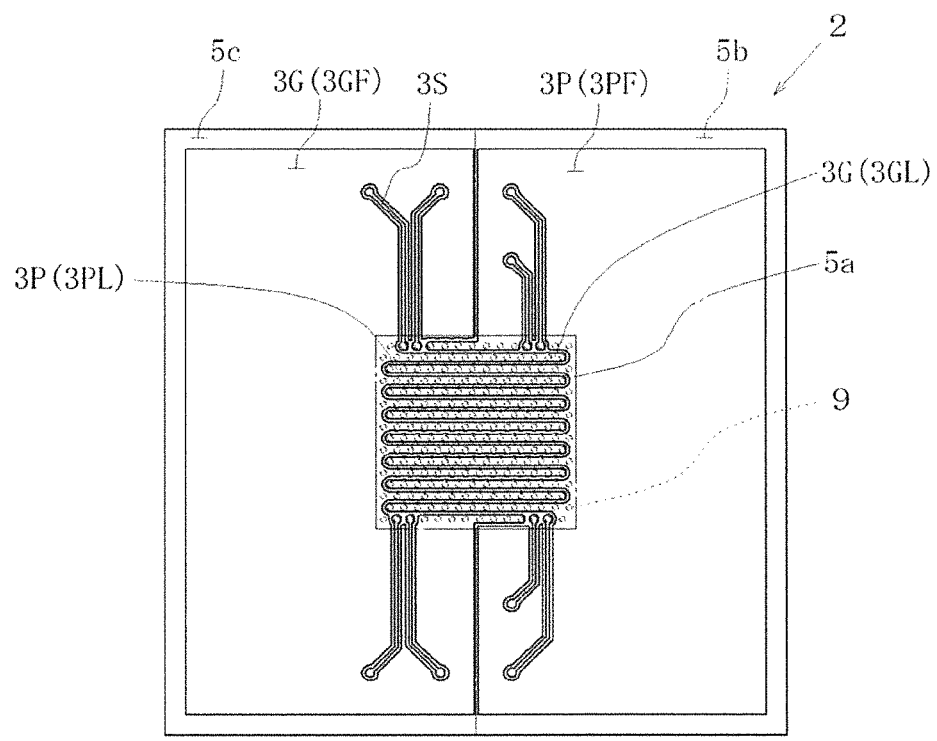
FIG. 2 is a schematic plan (top) view for illustrating the wiring board according to the present disclosure.
Figure 3:
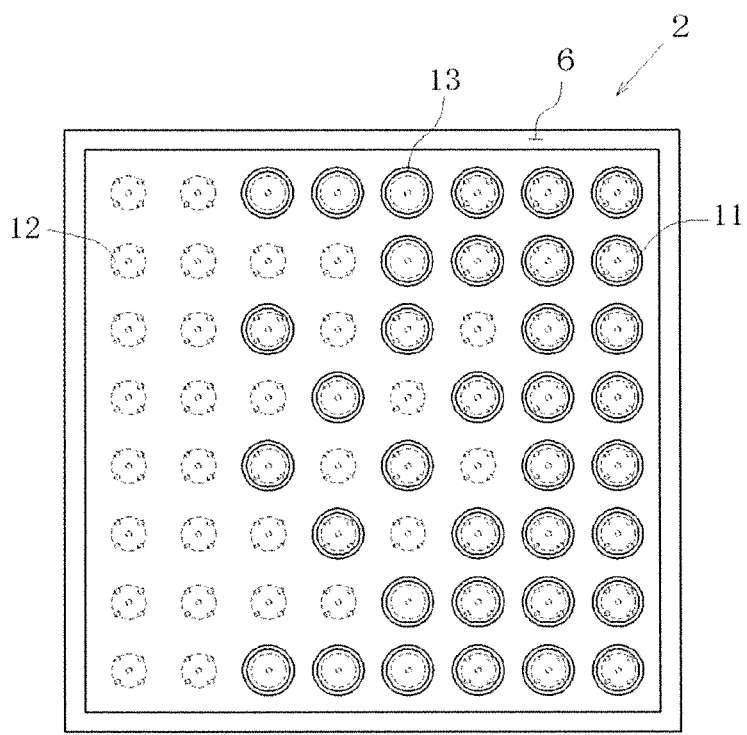
FIG. 3 is a schematic plan (bottom) view for illustrating the wiring board according to the present disclosure.

A wiring board 1 according to one embodiment of the present disclosure will be described with reference to FIGS. 1 to 3. FIG. 1 illustrates a schematic cross-sectional view of the wiring board 1. FIG. 2 illustrates a schematic top view of an insulating base 2. FIG. 3 illustrates a schematic bottom view of the insulating base 2.

The wiring board 1 according to one embodiment includes the insulating base 2, a wiring conductor 3, and a solder resist 4. The wiring board 1 has, for example, a quadrangular shape in a plan view. The thickness of the wiring board 1 is set to, for example, 0.3 to 1.5 mm.

The insulating base 2 has a first surface 5 including a mounting region 5a on which a semiconductor integrated circuit element S is mounted, and a second surface 6 connected to an external board. Furthermore, the first surface 5 has one side region 5b and an opposite side region 5c positioned around the mounting region 5a. The mounting region 5a has, for example, a square shape. The shape of the mounting region 5a may be a rectangular shape according to the shape of the semiconductor integrated circuit element S. The one side region 5b and the opposite side region 5c are positioned apart from a linear boundary positioned from a pair of opposite sides of the mounting region 5a to the outer peripheral edge of the insulating base 2. The one side region 5b has, for example, a function of securing an arrangement region of a power supply conductor 3P described below. The opposite side region 5c has, for example, a function of securing an arrangement region of a grounding conductor 3G described below.

In the wiring board 1 according to one embodiment, the insulating base 2 includes one layer of core insulating layer 2a and a buildup insulating layer 2b positioned with one layer on each of upper and lower surfaces of the core insulating layer 2a. The core insulating layer 2a has, for example, a function of securing the rigidity of the wiring board 1 and maintaining the flatness of the wiring board 1. The core insulating layer 2a contains a glass cloth and an insulating material such as an epoxy resin or a bismaleimide triazine resin. The core insulating layer 2a is formed flat by, for example, pressing a semi-cured prepreg in which a glass cloth is impregnated with an epoxy resin with a flat plate while heating.

The core insulating layer 2a has a plurality of through holes 7 penetrating from the upper surface to the lower surface. The through holes 7 adjacent to each other are positioned at predetermined adjacent intervals. The diameter of the through hole 7 is set to, for example, 100 to 300 µm. The adjacent interval of the through holes 7 is set to, for example, 150 to 350 µm. The through holes 7 are formed, for example, by blasting or drilling. In the through hole 7, a through hole conductor 8 including a part of the wiring conductor 3 is positioned. The through hole conductor 8 electrically connects the wiring conductors 3 positioned on the upper and lower surfaces of the core insulating layer 2a.

The buildup insulating layer 2b is positioned with one layer on each of the upper and lower surfaces of the core insulating layer 2a. The buildup insulating layer 2b has, for example, a function of securing an arrangement region of the wiring conductor 3 described below. The buildup insulating layer 2b contains an insulating particle and an insulating material such as an epoxy resin or a polyimide resin. The buildup insulating layer 2b is formed, for example, by sticking a resin film containing an epoxy resin in which silica is dispersed on the surface of the core insulating layer 2a under vacuum and thermosetting. Since the buildup insulating layer 2b has the above function, the buildup insulating layer 2b is thinner than the core insulating layer 2a.

The buildup insulating layer 2b has a plurality of via holes 9 whose bottom portions are the wiring conductors 3 positioned on the upper or lower surface of the core insulating layer 2a. In the via hole 9, a via hole conductor 10 including a part of the wiring conductor 3 is positioned. The via hole conductor 10 electrically connects the wiring conductors 3 positioned on the upper and lower sides with the buildup insulating layers 2b interposed therebetween. The diameter of the via hole 9 is set to, for example, 30 to 100 µm. The via hole 9 is formed, for example, by laser machining.

The wiring conductor 3 is positioned on the upper and lower surfaces of the core insulating layer 2a, on the upper or lower surface of the buildup insulating layer 2b, in the through hole 7, and in the via hole 9. The wiring conductor 3 includes the power supply conductor 3P, the grounding conductor 3G, and a signal conductor 3S. Each of the power supply conductor 3P, the grounding conductor 3G, and the signal conductor 3S is positioned at predetermined intervals so as not to short each other.

The power supply conductor 3P has a function of supplying power from an external power supply to the semiconductor integrated circuit element S mounted on the upper surface of the wiring board 1, for example. The power supply conductor 3P is needed to be positioned in a state of occupying a large area in the vicinity including the region directly below the semiconductor integrated circuit element S so as to supply power to the semiconductor integrated circuit element S quickly and with loss from the external power supply reduced. That is, the power supply conductor 3P enables the power supply characteristics to be improved by connecting the external power supply and the semiconductor integrated circuit element S in a short distance and with a wide path.

In the wiring board 1 according to one embodiment, the power supply conductor 3P includes a first planar conductor 3PF and a first linear conductor 3PL. The first planar conductor 3PF is positioned in the one side region 5b around the mounting region 5a on the first surface 5 of the insulating layer 2b closest to the semiconductor integrated circuit element S. That is, the first planar conductor 3PF has a planar wide path in the one side region 5b where the distance to the semiconductor integrated circuit element S is short. In the wiring board 1 according to one embodiment, the first planar conductor 3PF occupies approximately half of the region around the mounting region 5b.

The first planar conductor 3PF is electrically connected to an external power supply through the through hole conductor 8 and the via hole conductor 10 being a first through conductors positioned directly below the first planar conductor 3PF and further a power supply terminal 11 (details will be described below) connected to the electrode of an external board. In other words, since the first planar conductor 3PF is connected to the external power supply through the wiring conductor 3 positioned directly below the first planar conductor 3PF, the wiring board 1 according to one embodiment can shorten the power supply path even directly below the first planar conductor 3PF.

The first linear conductor 3PL is positioned to protrude from the first planar conductor 3PF into the mounting region 5a in a comb-shaped state on the first surface 5 of the insulating layer 2b closest to the semiconductor integrated circuit element S. Each of the first linear conductors 3PL is connected to a plurality of power supply electrodes of the semiconductor integrated circuit element S. That is, since the first linear conductor 3PL is connected to the power supply electrode of the semiconductor integrated circuit element S directly above the first linear conductor 3PL in the mounting region 5a, the first linear conductor 3PL can shorten the power supply path. Furthermore, since the first linear conductor 3PL protrudes into the mounting region 5a from the first planar conductor 3PF having a wide path connected to the external power supply in a short path, the first linear conductor 3PL can efficiently supply power with low resistance.

The first linear conductor 3PL is electrically connected to an external power supply through the through hole conductor 8 and the via hole conductor 10 being the first through conductors positioned directly below the first linear conductor 3PL and the power supply terminal 11 (details will be described below) connected to the electrode of an external board. In other words, since the first linear conductor 3PL is connected to the external power supply through the wiring conductor 3 positioned directly below the first linear conductor 3PL, the wiring board 1 according to one embodiment can shorten the power supply path even directly below the first linear conductor 3PL.

The first linear conductors 3PL are positioned to be alternately adjacent to second linear conductors 3GL described below in the mounting region 5a. Thus, since the power supply conductor 3P and the grounding conductor 3G are alternately positioned adjacent to each other, it is advantageous in that the loop inductance in the wiring board 1 can be reduced and the power supply characteristics can be improved. The width of the first linear conductor 3PL is set to, for example, 50 to 100 µm so that the power supply electrode of the semiconductor integrated circuit element S can be connected.

The grounding conductor 3G has a function of achieving power supply to the semiconductor integrated circuit element S together with the power supply conductor 3P by providing a potential difference between the grounding conductor 3G and the power supply conductor 3P. Therefore, as with the power supply conductor 3P, the grounding conductor 3G also enables the power supply characteristics to be improved by connecting the external power supply and the semiconductor integrated circuit element S in a short distance and with a wide path. In addition, the grounding conductor 3G has a function or the like of reducing stray capacitance generated between adjacent signal conductors 3S and absorbing radiation noise occurring from the signal conductors 3S.

In the wiring board 1 according to one embodiment, the grounding conductor 3G includes a second planar conductor 3GF and the second linear conductor 3GL. The second planar conductor 3GF is positioned in the opposite side region 5c opposite to the one side region 5b around the mounting region 5a on the first surface 5 of the insulating layer 2b closest to the semiconductor integrated circuit element S. That is, the second planar conductor 3GF is positioned in a state of securing a planar wide path in the opposite side region 5c where the distance to the semiconductor integrated circuit element S is short. In the present example, the second planar conductor 3GF occupies approximately half of the region around the mounting region 5a.

The second planar conductor 3GF is electrically connected to an external power supply through the through hole conductor 8 and the via hole conductor 10 being second through conductors positioned directly below the second planar conductor 3GF and a grounding terminal 12 (details will be described below) connected to the electrode of an external board. In other words, since the second planar conductor 3GF is connected to the external power supply through the wiring conductor 3 positioned directly below the second planar conductor 3GF, the wiring board 1 according to one embodiment can shorten the path length between the second planar conductor 3GF and the external power supply even directly below the second planar conductor 3GF.

The second linear conductor 3GL is positioned to protrude from the second planar conductor 3GF into the mounting region 5a in a comb-shaped state on the first surface 5 of the insulating layer 2b closest to the semiconductor integrated circuit element S. Each of the second linear conductors 3GL is connected to a plurality of grounding electrodes of the semiconductor integrated circuit element S. That is, since the second linear conductor 3GL is connected to the grounding electrode of the semiconductor integrated circuit element S directly above the second linear conductor 3GL in the mounting region 5a, it is possible to shorten the path length between the second linear conductor 3GL and the semiconductor integrated circuit element S. Furthermore, since the second linear conductor 3GL protrudes into the mounting region 5a from the second planar conductor 3GF having a wide path connected to the external power supply in a short path, the second linear conductor 3GL can efficiently supply power with low resistance.

The second linear conductor 3GL is electrically connected to an external power supply through the through hole conductor 8 and the via hole conductor 10 being the second through conductors positioned directly below the second linear conductor 3GL and the grounding terminal 12 (details will be described below) connected to the electrode of an external board. The second linear conductors 3GL are positioned to be alternately adjacent to the first linear conductors 3PL in the mounting region 5a. The power supply conductors 3P and the grounding conductors 3G are positioned to be alternately adjacent to each other. Therefore, as described above, it is advantageous in that the loop inductance in the wiring board 1 can be reduced and the power supply characteristics can be improved.

The width of the second linear conductor 3GL is set to, for example, 50 to 100 μm so that the grounding electrode of the semiconductor integrated circuit element S can be connected. The width of the second linear conductor 3GL is set to equal in width to the first linear conductor 3PL.

In the wiring board 1 according to one embodiment, the respective signal conductors 3S are positioned from the outer peripheral portion of the mounting region 5a to the one side region 5b and from the outer peripheral portion of the mounting region 5a to the opposite side region 5c. The signal conductor 3S is connected to the signal electrode of the semiconductor integrated circuit element S in the outer peripheral portion of the mounting region 5a. The signal conductor 3S is electrically connected to the external board through the through hole conductor 8 and the via hole conductor 10 being a through conductor, and a signal terminal 13 (details will be described below) connected to the electrode of the external board in the one side region 5b or the opposite side region 5c. Thus, the signal conductor 3S has a function of transmitting an electrical signal between the semiconductor integrated circuit element S and the external board. The width of the signal conductor 3S is set to, for example, 5 to 50 μm.

On the second surface 6 of the insulating base 2, the wiring conductor 3 includes the power supply terminal 11, the grounding terminal 12, and the signal terminal 13 connected to the electrodes of the external board. On the second surface 6, the power supply terminal 11 is positioned in a region overlapping with the first planar conductor 3PF in a plan perspective view and a region overlapping with the first linear conductor 3PL (these regions are referred to as a first region). Then, the power supply terminal 11 is electrically connected to the first planar conductor 3PF and the first linear conductor 3PL respectively through the through hole conductor 8 and the via hole conductor 10.

In other words, the power supply terminal 11 positioned on the second surface 6 is positioned in a place that can be connected to the first planar conductor 3PF or the first linear conductor 3PL in a short path through the wiring conductor 3 directly above the power supply terminal 11. This makes it possible to shorten the path between the power supply terminal 11 and the power supply conductor 3P. The power supply terminal 11 has, for example, a circular shape, and the diameter is set to, for example, 500 to 700 μm. Each power supply terminal 11 is provided one by one in a corresponding circular-shaped power supply terminal conductor individually provided.

On the second surface 6, the grounding terminal 12 is positioned in a region overlapping with the second planar conductor 3GF in a plan perspective view and a region overlapping with the second linear conductor 3GL (these regions are referred to as a second region). Then, the grounding terminal 12 is electrically connected to the second planar conductor 3GF and the second linear conductor 3GL respectively through the through hole conductor 8 and the via hole conductor 10.

In other words, the grounding terminal 12 positioned on the second surface 6 is positioned in a place that can be connected to the second planar conductor 3GF or the second linear conductor 3GL in a short path through the wiring conductor 3 directly above the grounding terminal 12. This makes it possible to shorten the path between the grounding terminal 12 and the grounding conductor 3G. A plurality of grounding terminals 12 are provided, for example, in one grounding terminal conductor positioned in a planar state at predetermined intervals around the power supply terminal 11 and the signal terminal 13, and the grounding terminal 12 has a circular shape with a diameter of 500 to 700 µm, for example.

The signal terminal 13 is positioned on the second surface 6 and is electrically connected to the signal conductor 3S positioned on the first surface 5 through the through hole conductor 8 and the via hole conductor 10. The signal terminal 13 has, for example, a circular shape, and the diameter is set to, for example, 500 to 700 µm. Each signal terminal 13 is provided one by one in a corresponding circular-shaped signal terminal conductor individually provided.

The wiring conductor 3 as described above is formed of a highly conductive metal such as copper by using a wiring forming technique such as a semi-additive method or a subtractive method.

In the wiring board 1 according to one embodiment, as illustrated in FIG. 1, the solder resist 4 is positioned on the upper surface of the buildup insulating layer 2b in the uppermost layer and the lower surface of the buildup insulating layer 2b in the lowermost layer. The solder resist 4 is not necessarily an essential component in the wiring board of the present disclosure. The solder resist 4 has a function of protecting the wiring conductor 3 from heat when the semiconductor integrated circuit element S is mounted on the wiring board 1, for example. The solder resist 4 on the upper surface has an opening 4a for exposing a part of the first linear conductor 3PL and the second linear conductor 3GL. The solder resist 4 on the lower surface has an opening 4b for exposing the power supply terminal 11, the grounding terminal 12, and the signal terminal 13.

The solder resist 4 is formed by, for example, sticking a film of a thermosetting resin having photosensitivity such as an acrylic-modified epoxy resin to the upper surface or the lower surface of the buildup insulating layer 2b, being exposed and developed to a predetermined pattern, and then being UV-cured and thermally cured.

Thus, the wiring board 1 according to the present disclosure includes: an insulating base 2 having a first surface 5 including a mounting region 5a and a second surface 6 connected to an external board, and a power supply conductor 3P including a first planar conductor 3PF positioned in one side region 5b around the mounting region 5a, and a plurality of first linear conductors 3PL protruding from the first planar conductor 3PF into the mounting region 5a in a comb-shaped state. The wiring board 1 according to the present disclosure further includes a grounding conductor 3G including a second planar conductor 3GF positioned in the opposite side region 5c opposite to the one side region 5b around the mounting region 5a, and a plurality of second linear conductors 3GL protruding from the second planar conductors 3GF into the mounting region 5a in a comb-shaped state to be alternately adjacent to the first linear conductors 3PL.

The wiring board 1 according to the present disclosure includes a plurality of power supply terminals 11, on the second surface 6, positioned in a first region overlapping with the first planar conductor 3PF in a plan perspective view, the plurality of power supply terminals 11 being electrically connected to the first planar conductor 3PF through a first through conductor between the first planar conductor 3PF and the first region. The wiring board 1 according to the present disclosure further includes a plurality of grounding terminals 12, on the second surface 6, positioned in a second region overlapping with the second planar conductor 3GF in a plan perspective view, the plurality of grounding terminals being electrically connected to the second planar conductor 3GF through a second through conductor between the second planar conductor 3GF and the second region.

As described above, the first planar conductor 3PF is positioned in a state of securing a planar wide path in the one side region 5b where the distance to the semiconductor integrated circuit element S is short. Furthermore, since the first planar conductor 3PF is connected to the external power supply through the first through conductor and the power supply terminal 11 positioned directly below the first planar conductor 3PF, it is possible to shorten the path between the first planar conductor 3PF and the power supply terminal 11.

The second planar conductor 3GF is positioned in a state of securing a planar wide path in the opposite side region 5c where the distance to the semiconductor integrated circuit element S is short. Furthermore, since the second planar conductor 3GF is connected to the external power supply through the second through conductor and the grounding terminal 12 positioned directly below the second planar conductor 3GF, it is possible to shorten the path between the second planar conductor 3GF and the grounding terminal 12.

Thus, according to the wiring board 1 of the present disclosure, it is possible to quickly supply power to the semiconductor integrated circuit element S with the loss from the external power supply reduced.

Furthermore, in the mounting region 5a, the first linear conductors 3PL and the second linear conductors 3GL are positioned to be alternately adjacent to each other. Therefore, it is possible to reduce the loop inductance in the wiring board 1 and it is advantageous to the improvement in the power supply characteristics.

The present disclosure is not limited to the above-described exemplary embodiment, and various modifications are possible without departing from the scope of the present disclosure.

For example, in the wiring board 1 according to the present disclosure, a case where the boundary between the first planar conductor 3PF and the second planar conductor 3GF is linear has been described, but the whole or part of the boundary may include a curved portion. This case is advantageous in that it is possible to improve the degree of freedom of the arrangement of the signal conductors 3S, for example.

In the wiring board 1 according to the present disclosure, as illustrated in FIG. 3, the case where the power supply terminal conductor provided with the power supply terminal 11 has an individual circular shape has been described. However, a plurality of elongated power supply terminal conductors including a plurality of circular power supply terminals 11 may be used.

Figure 4:
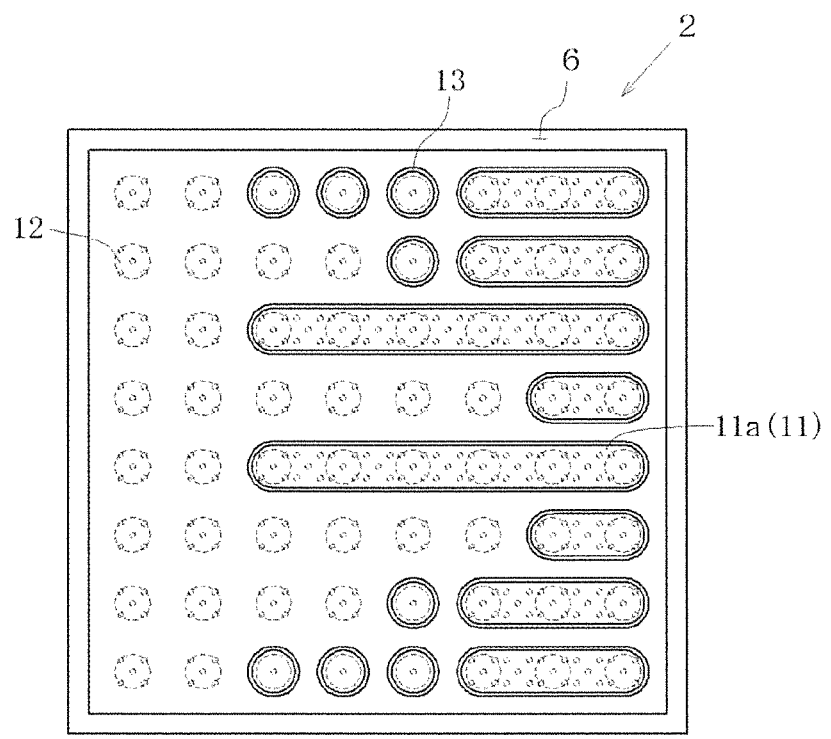
FIG. 4 is a schematic plan (bottom) view for illustrating another embodiment of the wiring board according to the present disclosure.

FIG. 4 illustrates a case where the power supply terminal 11 has, for example, an oval shape. An oval shaped terminal 11a is positioned on the second surface 6 in a state of connecting circular power supply terminals 11 adjacent to each other in FIG. 3, for example, with a highly conductive metal such as copper. For this reason, the oval shaped terminal 11a can secure a large conductor area as compared with a state in which the circular shaped power supply terminals 11 are individually present. Thus, more power supply terminals 11 (that is, oval shaped terminals 11a) and more first through conductors connecting the first planar conductor 3PF and the first linear conductors 3PL can be arranged.

As a result, the resistance value between the external power supply and the semiconductor integrated circuit element can be reduced, which is advantageous in that power supply characteristics can be improved.

A part of the grounding terminals 12 are positioned between the oval shaped terminals 11a as described above. As described above, since the grounding terminals 12 are positioned between the oval shaped terminals 11a, the effect of reducing the loop inductance in the wiring board 1 is obtained, which is advantageous in that the power supply characteristics can be improved.

In FIG. 4, a case where the longitudinal direction of each oval shaped terminal 11a is positioned in parallel with each other has been described. However, the present disclosure is not limited to this. The longitudinal direction of each terminal may be determined such that more first through conductors connecting the oval shaped terminal 11a and the first planar conductor 3PF can be arranged.

FIG. 4 illustrates a case where the power supply terminal 11 has an oval shape. However, from the viewpoint of electrical characteristics and productivity, the power supply terminal 11 may be appropriately set to a rectangular shape or an elliptical shape.

What is claimed is:

1. A wiring board comprising:
    an insulating base having a first surface including a mounting region for mounting a semiconductor integrated circuit element and a second surface connected to an external board, the insulating base in which a plurality of insulating layers are laminated;
    a power supply conductor including on the first surface:
        a first planar conductor positioned in one side region around the mounting region, and
        a plurality of first linear conductors protruding from the first planar conductor into the mounting region in a comb-shaped state, the plurality of first linear conductors to which a plurality of respective power supply electrodes of the semiconductor integrated circuit element are connected;
    a grounding conductor including on the first surface:
        a second planar conductor positioned in a region opposite to the one side region around the mounting region, and
        a plurality of second linear conductors protruding from the second planar conductor into the mounting region in a comb-shaped state to be alternately adjacent to the first linear conductors, the plurality of second linear conductors to which a plurality of respective grounding electrodes of the semiconductor integrated circuit element are connected;
    a plurality of power supply terminals, on the second surface, positioned in a first region overlapping with the first planar conductor in a plan perspective view, the plurality of power supply terminals being electrically connected to the first planar conductor through a first through conductor penetrating each of the plurality of insulating layers between the first planar conductor and the first region; and
    a plurality of grounding terminals, on the second surface, positioned in a second region overlapping with the second planar conductor in a plan perspective view, the plurality of grounding terminals being electrically connected to the second planar conductor through a second through conductor penetrating each of the plurality of insulating layers between the second planar conductor and the second region.

2. The wiring board according to claim 1, wherein the first linear conductors and the second linear conductors are equal in width to each other and are positioned at intervals equal to each other.

3. The wiring board according to claim 1, wherein a boundary between the first planar conductor and the second planar conductor is linear, and an extension of the boundary bisects the mounting region.

4. The wiring board according to claim 1, wherein a boundary between the first planar conductor and the second planar conductor includes a curved portion.

5. The wiring board according to claim 1,
    further comprising a plurality of power supply terminal conductors being elongated and including the plurality of power supply terminals on the second surface, and
    wherein a part of grounding terminal conductors including the plurality of grounding terminals are positioned between the power supply terminal conductors adjacent to each other.

* * * * *